United States Patent
Koshikawa et al.

Patent Number: 5,822,254
Date of Patent: Oct. 13, 1998

[54] SYNCHRONOUS SEMICONDUCTOR MEMORY DEVICE

[75] Inventors: Yasuji Koshikawa; Hisashi Abo, both of Tokyo, Japan

[73] Assignee: NEC Corporation, Tokyo, Japan

[21] Appl. No.: 791,034

[22] Filed: Jan. 29, 1997

[30] Foreign Application Priority Data

Jan. 30, 1996 [JP] Japan ................................. 8-014074

[51] Int. Cl.$^6$ ........................................................ G11C 7/00
[52] U.S. Cl. .............................. 365/189.05; 365/230.08; 365/233; 326/56
[58] Field of Search ..................... 365/189.05, 230.08, 365/233; 326/56, 57, 58

[56] References Cited

U.S. PATENT DOCUMENTS

| | | | |
|---|---|---|---|
| 5,043,944 | 8/1991 | Nakamura et al. | 365/189.05 |
| 5,488,581 | 1/1996 | Nagao et al. | 365/189.05 |
| 5,666,071 | 9/1997 | Hawkins et al. | 326/56 |

FOREIGN PATENT DOCUMENTS

| | | |
|---|---|---|
| 61-148692 | 7/1986 | Japan . |
| 4-85792 | 3/1992 | Japan . |
| 4-358392 | 12/1992 | Japan . |
| 6-76566 | 3/1994 | Japan . |
| 8-96573 | 4/1996 | Japan . |

*Primary Examiner*—Huan Hoang
*Attorney, Agent, or Firm*—Sughrue, Mion, Zinn, Macpeak & Seas, PLLC

[57] ABSTRACT

A semiconductor memory device of a synchronous type is disclosed, which has an output control circuit (14) adapted to output signals D2T and D2N by activating one of two conduction control signals D1T or by inactivating both of the conduction control signals in accordance with an output control signal MSK2B or OEB for controlling whether a data output terminal DQ is to be actuated or set into a high impedance, and an output circuit 17 provided with a couple of latch circuits 15 and 16 each adapted to individually latch and output the corresponding conduction control signals in synchronism with an internal synchronizing signal φ3. There is further provided an additional latch circuit 13 latching the output control signal in response to an inverted signal of the internal synchronizing signal φ3.

18 Claims, 6 Drawing Sheets

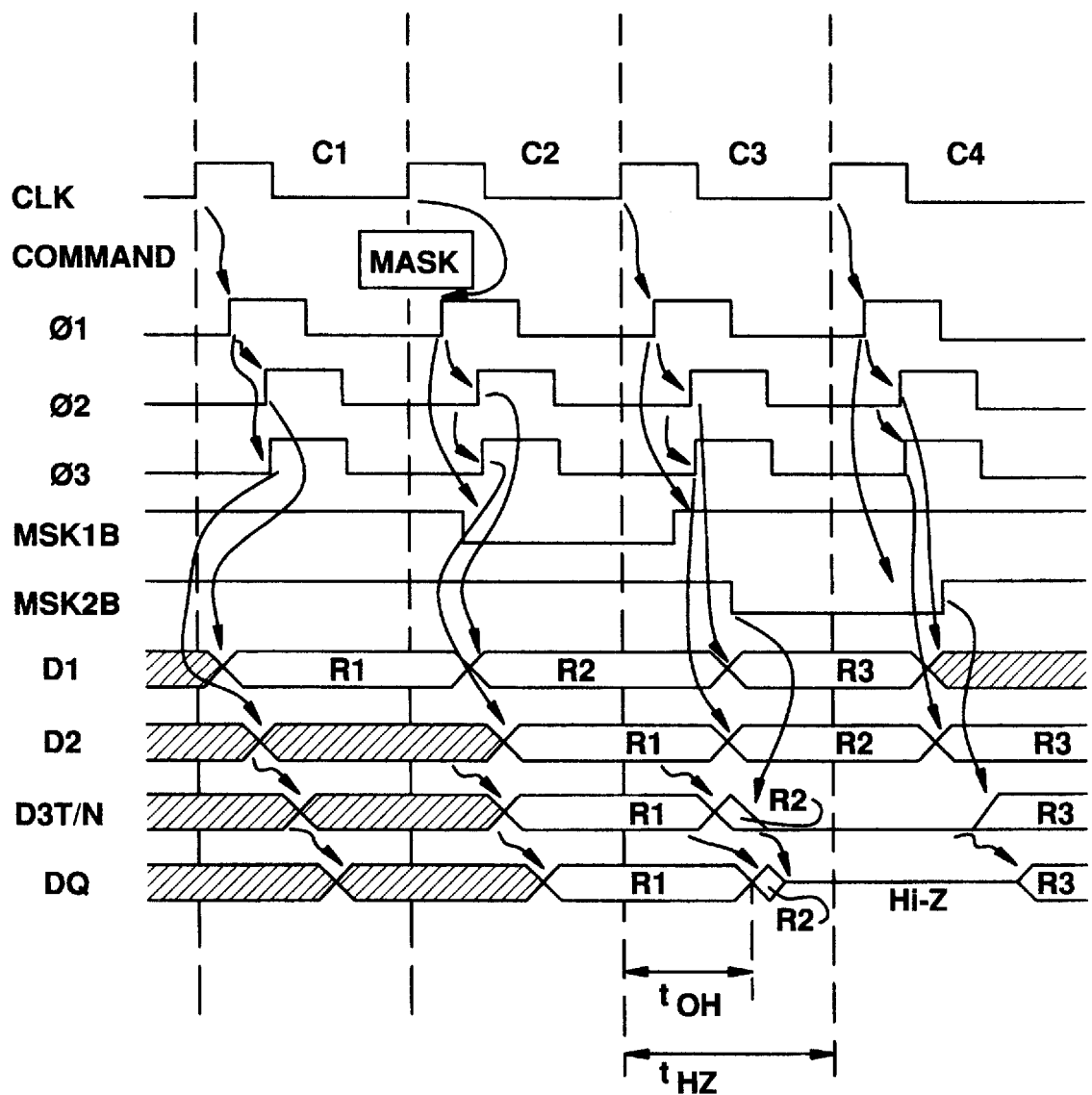

SYNCHRONOUS SEMICONDUCTOR MEMORY DEVICE

BACKGROUND OF THE INVENTION

1. Field of the Invention

This invention relates to a semiconductor memory device, and in particular to a synchronous semiconductor memory device having an internal pipeline structure.

2. Description of Related Art

With an advancement of a high-speed CPU in recent years, there has been a strong demand for a semiconductor memory device of higher speed. However, due to physical limitations to the miniaturization in the process of manufacturing the device or due to an enlargement of chip size resulting from a trend to increase the capacity of the device, such a demand is not necessarily fulfilled as yet.

Under the circumstances, as a means to solve this problem, a synchronous semiconductor memory device having an internal pipeline structure has been proposed by, for example, Japanese Laid-Open (Kokai) Patent Publication Sho 61-148692, Japanese Laid-Open (Kokai) Patent Publication Hei 6-76566, or Japanese Laid-Open (Kokai) Patent Publication 8-96573.

Referring now to FIG. 5, such a conventional semiconductor memory device is shown as a block diagram. this semiconductor memory device includes an input circuit 1 having a set of address terminals ADD, an input circuit 2 having a mask signal terminal DQM, and an input circuit 3 having a clock terminal CLK, which responds to an external clock CLK and outputs an internal synchronizing signal $\phi 1$. A burst counter 4 receives the output from the input circuits 1 and outputs a plurality of internal address signals IADD in synchronization with the internal synchronizing signal $\phi 1$. A column decoder 5 receives the internal address signals IADD and outputs a set column selective lines YSW to a sense amplifier circuit 7 coupled to a cell array 6 including a plurality of memory cells (not shown). The sense amplifier circuit 7 thus outputs the data from the selected memory cells of the cell array 6 while amplifying the data.

On the other hand, a synchronizing signal-generating circuit 8 responds to the internal synchronizing signal $\phi 1$ to produce an internal synchronizing signal $\phi 2$, and a synchronizing signal-generating circuit 9 also responds to the internal synchronizing signal $\phi 1$ to produce an internal synchronizing signal $\phi 3$. There are further provided a set of latch circuits 10 latching the data from the sense amplifiers 7 and outputting the latched data in synchronism with the internal synchronizing signal $\phi 2$, which is in turn supplied to a data amplifiers 24. The data D1 from the amplifier 24 is supplied to a D-F/F circuit 25 which in turn fetches the data D1 and outputs data D2 in synchronism with the internal synchronizing signal $\phi 3$.

A latch circuit 12 is further provided for receiving the output from the input circuit 2 and outputting a mask signal MSK1B in synchronism with the internal synchronizing signal $\phi 1$. A D-F/F circuit 27 receives the output from the latch circuit 12 and outputs a signal in synchronism with the internal synchronizing signal $\phi 3$, which signal is delayed by a delay element DL and produced as a mask signal MSK2B. This signal MSK2B and the data D2 are supplied to an output control circuit 26 includes gates AN3 and AN4, the output signals D3T and D3N are in turn supplied to an output circuit 17 to drive an output terminal DQ by use of transistors Tr1 and Tr2.

The output control circuit 26 is composed of the AND gate AN3 for inputting the data D2 and the mask signal MSK2B and outputting conduction control signals D3T, and the AND gate AN4 for inputting a reversed signal of the data D2 and the mask signal MSK2B and outputting conduction control signals D3N. The mask signal MSK2B to be input in this case is an output control signal for controlling whether the output terminal DQ of the output circuit 17 should be actuated or put into a high impedance. The output control circuit 26 is designed to output a signal by activating one of the conduction control signals D3T and D3N or by inactivating each of the conductor control signals D3T and D3N in accordance with the mask signal MSK2B and the data D2.

The output circuit 17 is composed of an N-channel output transistor Tr1 which is connected between a power source and the output terminal DQ, the gate thereof being constituted by the conduction control signal D3T, and another N-channel output transistor Tr2 which is connected between the output terminal DQ and the ground, the gate thereof being constituted by the conduction control signal D3N. The output circuit 17 is so designed that it outputs a high level of signal by actuating the output terminal DQ when only the conduction control signal D3T is activated, While it outputs a low level of signal by actuating the output terminal DQ when only the conduction control signal D3N is activated. On the other hand, when the conduction control signals D3T and D3N are being inactivated, the output terminal DQ is set into the state of high impedance.

Next, the operation of the conventional semiconductor memory device shown in FIG. 5 will be explained with reference also to FIG. 6 which shows a waveform diagram illustrating the operation in the case of a read burst operation with "CAS latency" being set to 3 (CAS latency=3). This term "CAS latency", indicates that how many times of clock cycle is necessitated at a time interval, i.e. after the read command is input from the outside and before a data is output from the output terminal. Therefore, "CAS latency= 3" means that three cycles are necessitated. Meanwhile, the term "burst" indicates a continuous reading of data of any number of bits by the input of one read command. Therefore, at the burst counter 4, an internal address corresponding to "burst length" is produced.

In response to the external clock CLK being shifted from a low level to a high level, the internal synchronizing signal $\phi 1$ is changed to the high level, so that a high level of pulse is also generated in each of the internal synchronizing signals $\phi 2$ and $\phi 3$.

When a mask command as command data DQM is input at the cycle C2, the mask signal MSK1B becomes level low in synchronism with the internal synchronizing signal $\phi 1$ of this cycle. When the internal synchronism signal $\phi 3$ is shifted from the low level to the high level, the mask signal MSK2B becomes low in level after a predetermined delay of the delay element DL. On the other hand, the data R2 corresponding to the cycle C2 is output at first as the data D1 from the data amplifier 24 in synchronism with the internal synchronizing signal $\phi 2$, and then as the data D2 from the D-F/F circuit 25 in synchronism with the internal synchronizing signal $\phi 3$.

The data R2 is also transmitted in conformity with the data D2 to the conduction control signals D3T and D3N of the output control circuit 14. However, when the mask signal MSK2B becomes low in level, the conduction control signals D3T and D3N becomes also low in level. As a result, both of N-channel output transistors Tr1 and TR2 in the output circuit 17 are turned OFF, thus rendering the output terminal DQ in a state of high impedance (Hi-Z).

Then, when no command is input at the cycle C3, the mask signal MSK1B becomes high in level in synchronism with the internal synchronizing signal φ1 of this cycle. When the internal synchronizing signal φ3 is shifted from a high level to a low level, the mask signal MSK2B becomes high in level after a predetermined delay of the delay element DL. Therefore, the data R3 is transmitted in conformity with the data D2 to the conduction control signals D3T and D3N of the output control=circuit 14–16. As a result, one of N-channel output transistors Tr1 and and Tr2 is turned ON, and hence the data R3 is supplied to the output terminal DQ.

The time interval starting from the state of high level of the external clock CLK at the cycle 3 to the time when the output terminal DQ is turned into a state of high impedance (Hi-Z) is prescribed as a critical value called tHZ. Accordingly, the output terminal DQ is required to be turned into a state of high impedance (Hi-Z) earlier than the critical value tHZ. Moreover, the data R1 being supplied to the output terminal DQ after the external clock CLK at the cycle C3 is turned into a high level is required to be retained for a time period longer than that prescribed by the critical value tOH.

According to this conventional semiconductor memory device, the timing for turning the output terminal DQ into a state of high impedance (Hi-Z) after the input of the mask command is determined by the delay time of the delay element DL for outputting the mask signal MSK2B, i.e. an output control signal. For this reason, if this delay time is too short, the output terminal DQ is turned into a state of high impedance (Hi-Z) too fast, thus badly affecting the critical value tOH. On the other hand, if this delay time is too long, the output terminal DQ is turned into a state of high impedance (Hi-Z) too late, thus badly affecting the critical value tHZ. Therefore, the optimization of the delay time of the delay element DL is very important.

However, there is a problem in this optimization of the delay time that it requires an increase in the number of steps for designing it or a delay in the manufacture of the product, otherwise it requires a relaxation of the specified values tOH and tHZ.

Another synchronous semiconductor memory device which is provided with a latch circuit for effecting a pipe-line operation is proposed in Japanese Laid-Open (Kokai) Patent Publication Hei 4-85792, or Japanese Laid-Open (Kokai) Patent Publication Hei 4-358392. However, these publications fail to disclose anything about the enable (data output) or disable (high impedance) of output during the burst. For this reason the same problems as described above are raised in the control of output in the circuits disclosed in these patent publications.

SUMMARY OF THE INVENTION

Accordingly, an object of the present invention is to easily optimize the timing for the data output and high impedance of the output terminals in a synchronous semiconductor memory device having an internal pipe-line structure.

Namely, according to one aspect of the present invention, there is provided a semiconductor memory device which includes an output circuit provided with a couple of output transistors which are adapted to be independently controlled in accordance with individual condition control signals and to actuate an output terminal so as to output a data accessed from a memory cell, and an output control circuit adapted to output signals by activating one of said individual conduction control signals or by inactivating said individual conduction control signals in accordance with an output control signal for controlling whether said output terminal of the output circuit is to be actuated or set into a high impedance; and is characterized by further including a couple of latching means, each adapted to individually latch and output said conduction control signals in synchronism with an internal synchronizing signal, and each of said output transistors of the output circuit is separately controlled in accordance with the output of each of said latching means.

The aforementioned output control circuit is adapted to input the output control signal which changes in synchronism with an inverted phase of the internal synchronizing signal.

BRIEF DESCRIPTION OF THE DRAWINGS

The above and other objects, advantages and features of the present invention will be more apparent from the following description taken in conjunction with the accompanying drawings, in which:

The FIG. 5 is a block diagram showin one example of the conventional semiconductor memory device; and FIG. 6 is a waveform diagram showing an example of operation of the semiconductor memory device shown in FIG. 5.

DESCRIPTION OF THE PREFERRED EMBODIMENT

Figure 1:
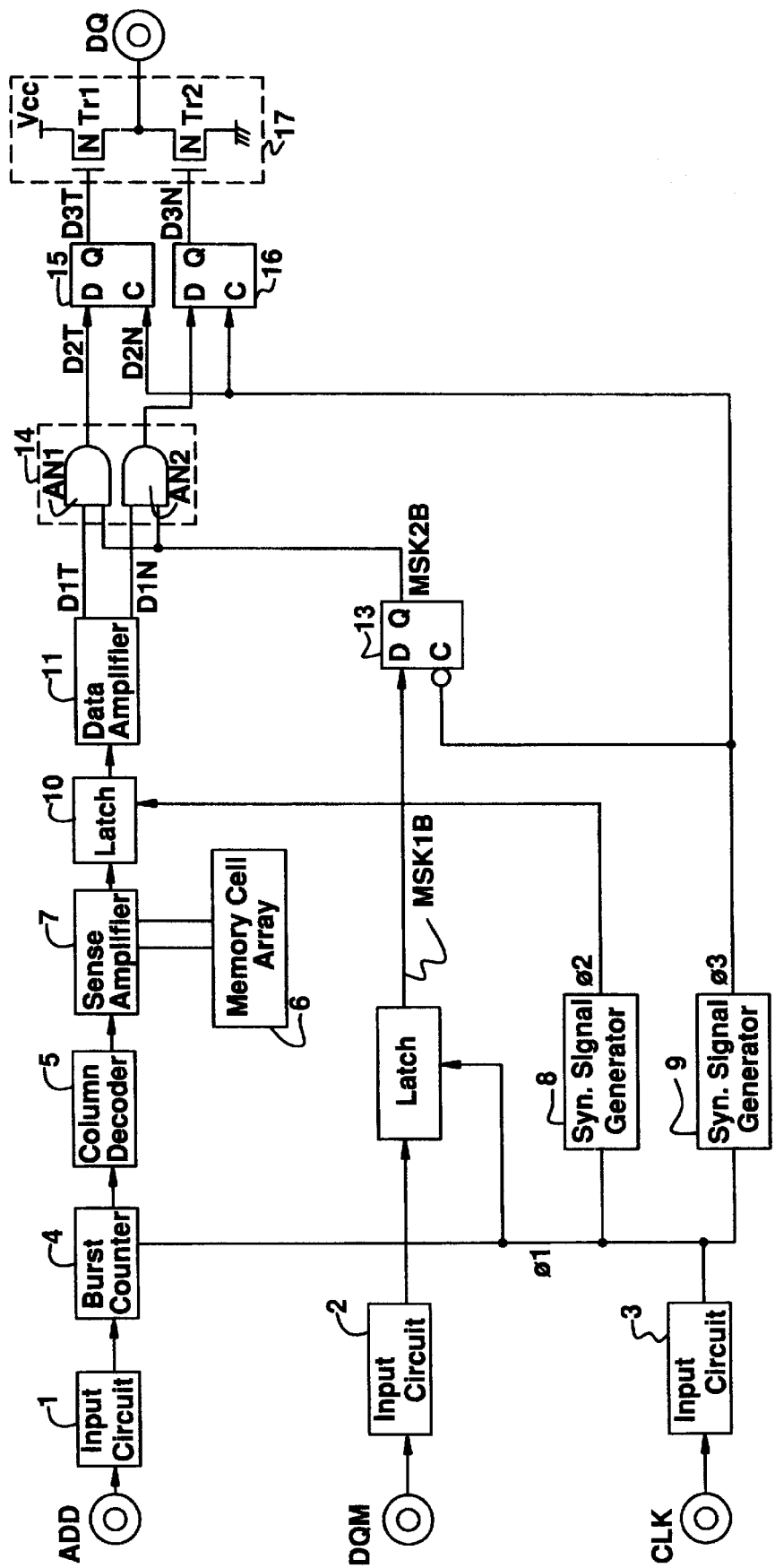
FIG. 1 is a block diagram showing one embodiment of the semiconductor memory device according to this invention.
Figure 5:
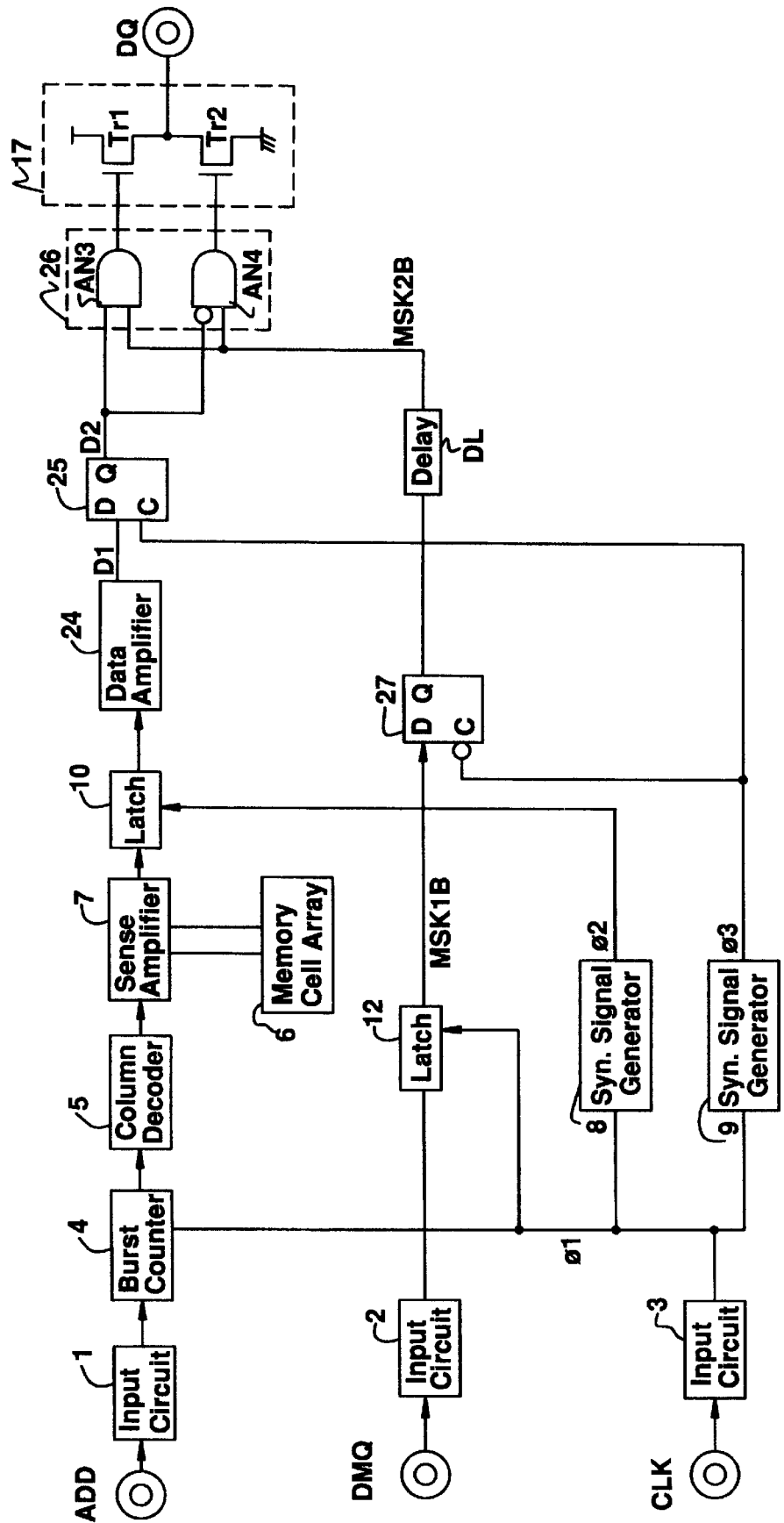

Referring now to FIG. 1, there is shown a semiconductor memory device according to an embodiment of this invention, in which the same constituents as those shown in FIG. 5 are denoted by the same reference numerals to omit the further description thereof. In this memory, a data amplifier 11 receives the output from the latch circuit 10 and producing a true data signal D1T and a complementary data signal D1N indicative of the received data. These signals D1T and D1N are supplied to an output control circuit 14 together with the mask signal MSK2B from D-F/F circuit 13 which responds to the change of the signal φ3 from the high to low level. In response to these signals, the output control circuit 14 produces conduction control signals D2T and D2N which are in turn supplied to D-F/F circuits 15 and 16, respectively. These circuits 15 and 16 catch the conduction control signals D2T and D2N in synchronism with the internal synchronizing signal φ3 and produce drive control signals D3T and D3N, respectively. In response to these signals D3T and D3N, an output circuit 17 drives an output terminal DQ.

The output control circuit 14 is composed of an AND gate AN1 supplied with the data signal D1T and the mask signal MSK2B and outputting the conduction control signal D2T, and an AND gate AN2 supplied with the data signal D1N and the mask signal MSK2B and outputting the conduction control signal D2N. The mask signal MSK2B to be input in this case is an output control signal for controlling whether the output terminal DQ of the output circuit 17 should be actuated or put into a high impedance. The output control circuit 14 is designed to output a signal by activating one of the conduction control signals D2T and D2N or by inactivating each of the conduction control signals D2T and D2N in accordance with the mask signal MSK2B and the data signals D1T and D1N.

The output circuit 17 is composed of an N-channel output transistor Tr1 connected between a power source and the output terminal DQ, the gate thereof being supplied with the conduction control signal D3T, and an N-channel output transistor Tr2 connected between the output terminal DQ and the ground, the gate thereof being supplied with the conduction control signal D3N. The output circuit 17 is so designed that it outputs a high level of signal by actuating the output terminal DQ when the conduction control signal D3T is activated, i.e. the high level, while it outputs a low level of signal by actuating the output terminal DQ when the conduction control signal D3N is activated, i.e. the high level. On the other hand, when the conduction control signals D3T and D3N are both being inactivated, i.e., the low level, the output terminal DQ is brought into a state of high impedance.

Figure 2:
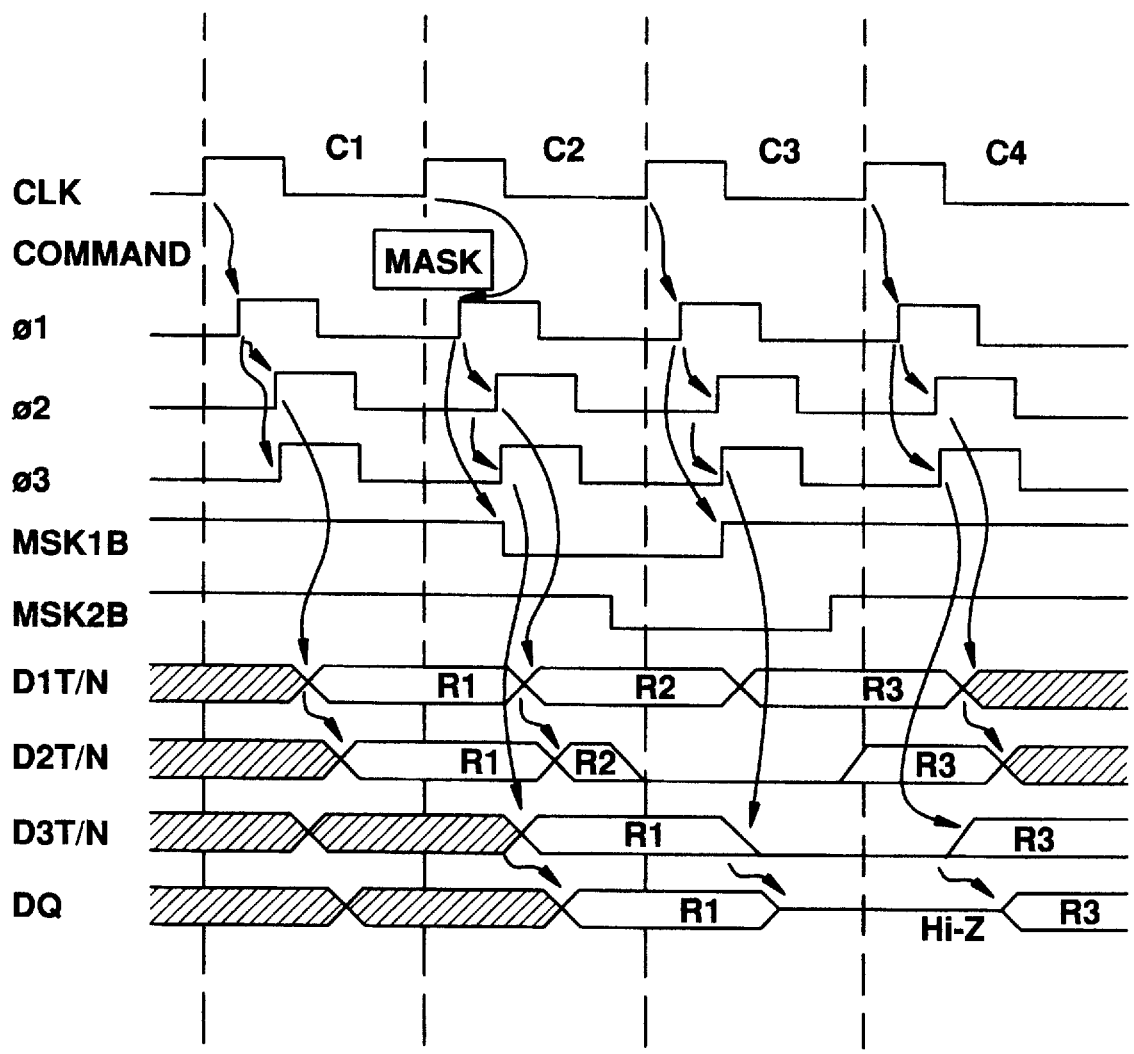
FIG. 2 is a waveform diagram showing an example of operation of the semiconductor memory device shown in FIG. 1.

Next, the operation of the above memory will be explained below with reference also to FIG. 2 which shows a waveform diagram illustrating a read burst operation when "CAS latency" is set to 3 (CAS latency=3).

When a mask command is input at the cycle C2, the mask signal MSK1B becomes low in level in synchronism with the internal synchronizing signal $\phi 1$ of this cycle. When the internal synchronizing signal $\phi 3$ is shifted from a high level to a low level, the mask signal MSK2B becomes low in level. On the other hand, the data R2 corresponding to the cycle C2 is produced at first as the data D1T and D1N from the data amplifier 11 in synchronism with the internal synchronizing signal $\phi 2$, and thereafter the conduction control signals D2T and D2N are produced from the output control circuit 14.

However, since the mask signal MSK2B is at the low level when the internal synchronizing signal $\phi 3$ changes from the low level to the high level, the output control circuit 14 changes each of the outputs D2T and D2N to the low level irrespective of the data R2. Accordingly, the output terminal DQ is not driven by the data R2, but brought into a state of high impedance (Hi-Z).

When no command is input at the cycle C3, on the other hand, the mask signal MSK1B becomes high in level in synchronism with the internal synchronizing signal $\phi 1$ of this cycle. When the internal synchronizing signal $\phi 3$ is shifted from a high level to a low level, the mask signal MSK2B becomes high. On the other hand, the data R3 complying with the cycle 3 is output as the data D1T/N from the data amplifier 11 in synchronism with the internal synchronizing signal $\phi 2$. However, the mask signal MSK2B becomes high in level by the change of the signal $\phi 3$ from the high level to the low level. Accordingly, the conduction control signals D2T and D2N take the respective levels responsive to the data R3. These level are then latched by the F/F circuits 15 and 16 by the high level of the next synchronizing signal $\phi 3$. As a result, one of the output transistors Tr1 and Tr2 is turned ON, to drive the output terminal DQ at the level corresponding to the data D3.

Figure 3:
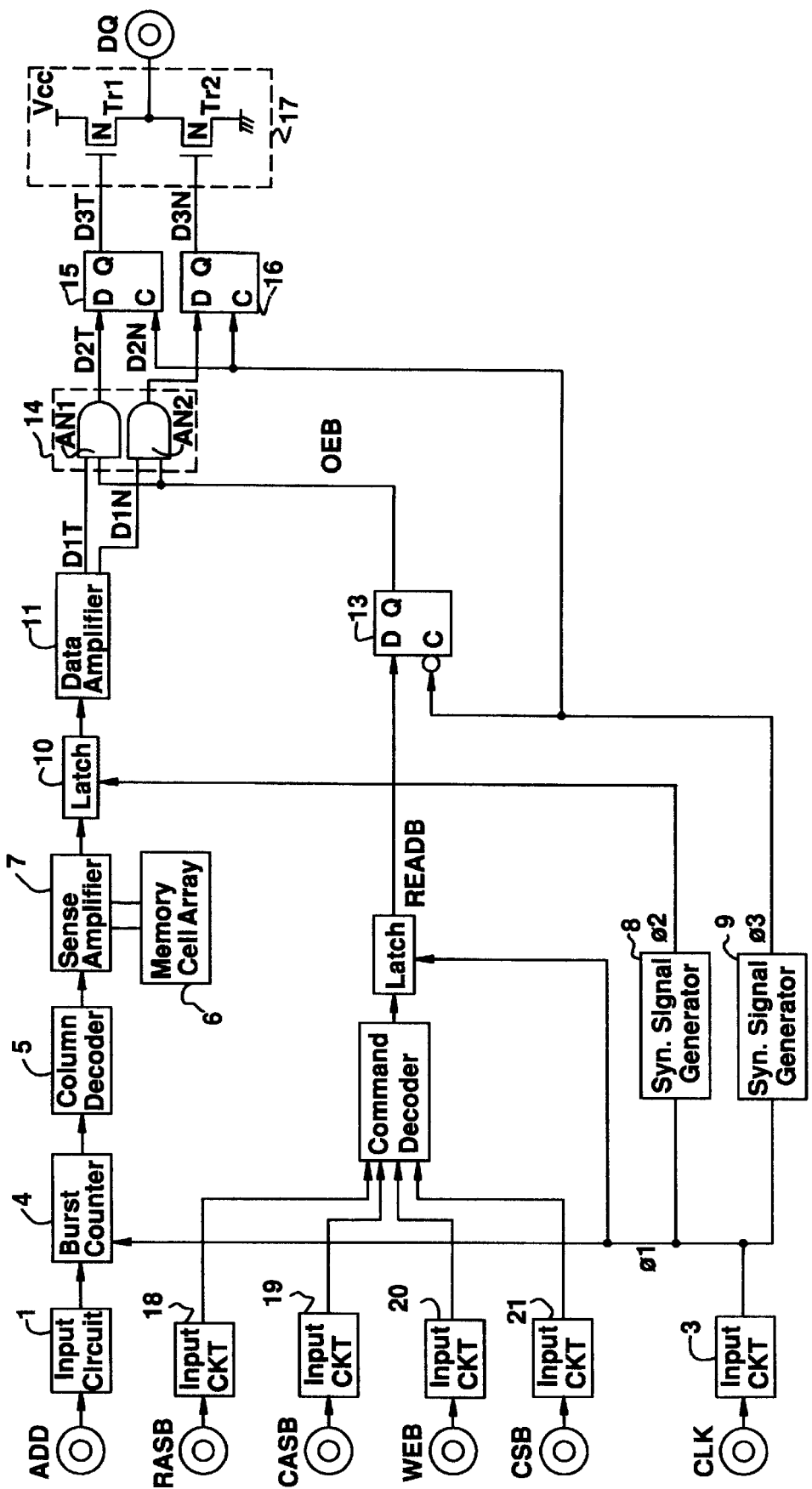
FIG. 3 is a block diagram showing another embodiment of the semiconductor memory device according to this invention.

Turning to FIG. 3, there is shown a memory device according to another embodiment of this invention, in which the same constituents as those shown in FIG. 1 are denoted by the same reference numerals to omit the further description thereof. In this memory, there are provided an input circuit 18 receiving a row address strobe signal RASB, an input circuit 19 receiving a column address strobe signal CASB, an input circuit 20 receiving a write-enable signal WEB, and an input circuit 21 receiving a chip-select signal CSB. These signals are then supplied to a command decoder 22 whose output signal is in turn applied to a latch circuit 23 controlled by the signal $\phi 1$. The output of the latch circuit 23 is led out as a read signal READB and supplied to the F/F circuit 13. The output signal of the F/F circuit 13 is led out as an output-enable signal OEB in this embodiment, which is in turn supplied to the output control circuit 14.

Figure 4:
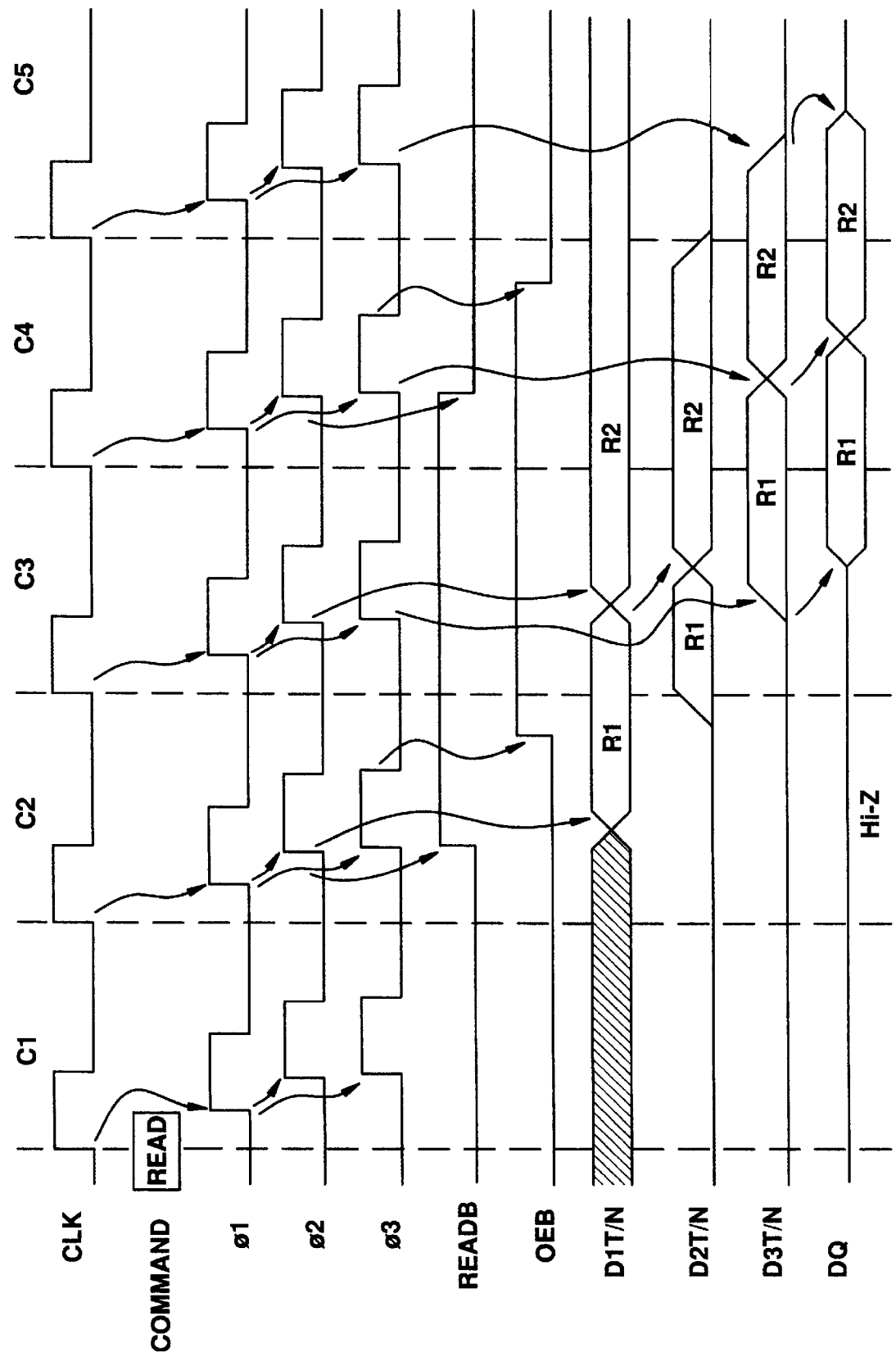
FIG. 4 is a waveform diagram showin an example of operation of the semiconductor memory device shown in FIG. 3.

Next, the operation of this memory device will be explained with reference also to FIG. 4 which shows a waveform diagram illustrating the operation wherein "CAS latency" is set to 3 (CAS latency=3) and "burst length" is set to 2 (burst length=2).

When the signals RASB, CASB, WEB and CSB are supplied with a logic combination indicative of a read command at the cycle C1, this logic combination is decoded by the decoder 22. The read signal READB thereby becomes high in level in synchronism with the internal synchronizing signal $\phi 1$ in the next cycle C2. When the internal synchronizing signal $\phi 3$ is shifted from a high level to a low level, the output-enable signal OEB becomes high in level. However, the signal OEB is held at the low level at the timing when the signal $\phi 3$ is changed to the high level. Accordingly, the data R1 does not appear at the output terminal DQ in the cycle C2.

Since the signal OEB is changed to the high level at the end of the cycle C2, the control signal D2T and D2N take the respective levels responsive to the data R1 in the cycle C3. Accordingly, the high level of the internal synchronizing signal $\phi 3$ in the cycle C3 has the F/F circuits 15 and 16 catch the signals D2T and D2N, respectively. As a result, one of the output transistors Tr1 and Tr2 is turned ON to drive the output terminal DQ at the level corresponding to the data R1.

Since the burst length is set to 2, the read signal READB becomes low in level in synchronization with the internal synchronizing signal $\phi 1$ of the cycle C4, and when the internal synchronizing signal $\phi 3$ is shifted from the high level to the low level in the cycle C4, the output-enable signal OEB is turned to the low level. Accordingly, the data R2 appears at the output terminal DQ in the cycle C4, but the output terminal DQ is brought into the high impedance state in the cycle C5.

As explained above, the semiconductor memory device according to this invention is provided with a plurality of latching circuits, each adapted to individually latch and output a conduction control signal in synchronization with an internal synchronizing signal of controlling the internal pipe line, and each of the output transistors of the output circuit is separately controlled in accordance with the output of each of said latching circuits. Therefore, the non-uniformity in delay of time interval from the input of the internal synchronizing signal into each latching circuit to each output transistor can be minimized, so that all of the output terminals can be actuated with the same timing to take a high level or a low level, or to be put into the state of a high impedance. Accordingly, the optimization of the relevant specified timing values (tHZ, tOH) can be easily performed.

Moreover, since the non-uniformity of delay can be minimized as explained above, the fluctuation due to non-uniformity in product and the changes in voltage of power source can be also minimized, so that the characteristic obtainable by the relevant specified timing values can be further improved.

It is apparent that the present invention is not limited to the above embodiments but may be changed and modified without departing from the scope and spirit of the invention. For example, by replacing the AND gate AN1 with a NAND gate, a P-channel MOS transistor can be employed in place of the transistor Tr1.

We claim:

1. A semiconductor memory device comprising:
a data output terminal,
an output circuit coupled to said output terminal and responding to first and second data signals to drive said output terminal at a first logic level when said first and second data signals take a first state and at a second logic level when said first and second data signals take a second state and to bring said output terminal into a high impedance state when said first and second data signals take a third state,
a first latch circuit provided to latch and supply said first data signal to said output circuit in response to a latch-enable signal,
a second latch circuit provided to latch and supply said second data signal to said output circuit in response to said latch-enable signal, and
a third latch circuit producing a control signal in response to an inverted signal of said latch-enable signal so that said first and second data signals take said third state in response to said control signal.

2. The device as claimed in claim 1, further comprising:
a data amplifier amplifying data stored in a selected memory cell to output a third data signal and a fourth data signal complementary to said third data signal; and
an output control circuit comprising a first logic gate responding said third data signal and said control signal to output said first data signal and a second logic gate responding said fourth data signal and said control signal to output said second data signal.

3. The device as claimed in claim 1, further comprising:
an output control circuit, connected to said first latch circuit and to said second latch circuit, outputting said first and second data signals in response to a third data signal and a fourth data signal, respectively, said output control circuit further receiving said control signal and controlling said first and second data signals to take said third state irrespective of a level of said third and fourth data signals when said control signal is at a predetermined level.

4. The device as claimed in claim 3, further comprising:
a command decoder receiving and decoding a plurality of command signals to produce a decoded command signal; and
a fourth latch circuit latching and supplying said decoded command signal to said third latch circuit as said control signal in response to a clock signal.

5. The device as claimed in claim 3, further comprising:
a data amplifier amplifying said data stored in said selected memory cell to output said third data signal and said fourth data signal complementary to said third data signal;
wherein said output control circuit comprises a first logic gate responding said third data signal and said control signal to output said first data signal and a second logic gate responding said fourth data signal and said control signal to output said second data signal.

6. The device as claimed in claim 5, wherein each of said first through third latch circuits is a D-Flip/Flop and each of said first and second logic gates is an AND gate.

7. A semiconductor memory device comprising:
an output terminal;
an output control circuit outputting a first data signal and a second data signal;
a first latch circuit latching said first data signal and outputting said first data signal when a latch enable signal changes logic levels from a first logic level to a second logic level;
a second latch circuit latching said second data signal and outputting said second data signal when said latch enable signal changes logic levels from a first logic level to a second logic level;
a first transistor coupled to a first power source line and to said output terminal, and having a first control gate receiving said first data signal;
a second transistor coupled to a second power source line and to said output terminal, and having a second control gate receiving said second data signal; and
a third latch circuit latching and supplying a control signal to said output control circuit when said latch enable signal changes from said second logic level to said first logic level;
said output control circuit supplying said first and second data signals to said first and second latch circuits when said control signal in a first state, and said output control circuit preventing supply of said first and second data signals when said control signal is in a second state.

8. The device as claimed in claim 7, further comprising:
a command decoder receiving and decoding a command signal to produce a decoded command signal; and
a fourth latch circuit latching and supplying said decoded command signal to said third latch circuit as said control signal in response to a clock signal.

9. The device as claimed in claim 7, wherein said output control circuit comprises a first logic gate receiving said first data signal and said control signal and having an output node for supplying said first data signal to said first latch circuit; and a second logic gate receiving said second data signal and said control signal and having an output node for supplying said second data signal to said second latch circuit.

10. The device as claimed in claim 9, wherein each of said first through third latch circuits is a D-Flip/Flop and each of said first and second logic gates is an AND gate.

11. The device as claimed in claim 9, wherein said second data signal is complementary to said first data signal.

12. The device as claimed in claim 11, further comprising:
a data amplifier, connected to said output control circuit, amplifying data stored in a selected memory cell to output said first data signal and said second data signal complementary to said first data signal.

13. A semiconductor memory device comprising:
a burst controller receiving an address signal to produce an internal address signal in response to a clock signal;
a memory cell array including a plurality of memory cells;
a first latch circuit latching a control signal in response to said clock signal;
a first signal generator producing a first synchronizing signal based on said clock signal;
a second signal generator producing a second synchronizing signal based on said clock signal;
a second latch circuit latching data output from a memory cell of said memory cell array selected by said internal address signal in response to said first synchronizing signal;

a data amplifier amplifying said data latched by said second latch circuit to produce a first data signal and a second data signal;

a first flip-flop circuit latching said control signal in response to an inverse second synchronizing signal to output a latched control signal;

an output control circuit receiving said first and second data signals, said output control circuit outputting a third data signal corresponding to said first data signal and a fourth data signal corresponding to said second data signal when said latched control signal is at a first logic level, said output control signal outputting said third and fourth data signals irrespective of logic levels of said first and second data signals when said latched control signal is at a second logic level;

a second flip flop circuit latching and outputting said third data signal in response to said second synchronizing signal;

a third flip flop circuit latching and outputting said fourth data signal in response to said second synchronizing signal; and an output circuit receiving said third and fourth data signals and having an output terminal.

14. The device as claimed in claim 13, further comprising:

a command decoder receiving and decoding a plurality of command signals to supply a decoded command signal to said first latch circuit as said control signal.

15. The device as claimed in claim 13, wherein said output control circuit comprises a first logic gate receiving said first data signal and said latched control signal and having an output node connected to said first flip flop circuit; and a second logic gate receiving said second data signal and said control signal and having an output node connected to said second flip flop circuit.

16. The device as claimed in claim 15, wherein said fourth data signal is complementary to said third data signal.

17. The device as claimed in claim 13, wherein said output circuit comprises a first transistor coupled to a first power source line and to said output terminal and having a control gate connected to said second flip flop for receiving said third data signal; and a second transistor coupled to a second power source line and to said output terminal and having a control gate connected to said third flip flop for receiving said fourth data signal.

18. The device as claimed in claim 17, wherein each of said first and second transistors is a N-channel MOS transistor and each of said first and second logic gates is an AND gate.

* * * * *